United States Patent
Liu et al.

(10) Patent No.: US 11,417,643 B2
(45) Date of Patent: Aug. 16, 2022

(54) PACKAGE-ON-PACKAGE WITH REDISTRIBUTION STRUCTURE

(71) Applicant: Taiwan Semiconductor Manufacturing Company, Ltd., Hsinchu (TW)

(72) Inventors: Yu-Chih Liu, Taipei (TW); Kuan-Lin Ho, Hsinchu (TW); Wei-Ting Lin, Taipei (TW); Chin-Liang Chen, Kaohsiung (TW); Jing Ruei Lu, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/674,720

(22) Filed: Nov. 5, 2019

(65) Prior Publication Data
US 2020/0066704 A1 Feb. 27, 2020

Related U.S. Application Data

(60) Division of application No. 15/859,097, filed on Dec. 29, 2017, now Pat. No. 10,515,941, which is a (Continued)

(51) Int. Cl.
*H01L 25/065* (2006.01)
*H01L 23/538* (2006.01)
(Continued)

(52) U.S. Cl.
CPC ............ *H01L 25/50* (2013.01); *H01L 21/565* (2013.01); *H01L 23/49811* (2013.01);
(Continued)

(58) Field of Classification Search
CPC ............. H01L 25/0655; H01L 25/0652; H01L 23/5389
See application file for complete search history.

(56) References Cited

U.S. PATENT DOCUMENTS 8,884,422 B2 11/2014 Goh et al.
9,000,587 B1 4/2015 Kelkar et al.
(Continued)

OTHER PUBLICATIONS

Braun, T., et al., "From Wafer Level to Panel Level Mold Embedding," Electronic Components & Technology Conference, IEEE, 2013, pp. 1235-1242.

*Primary Examiner* — Allen L Parker
*Assistant Examiner* — Gustavo G Ramallo
(74) *Attorney, Agent, or Firm* — Slater Matsil, LLP

(57) ABSTRACT

Embodiments relate to packages and methods of forming packages. A package includes a package substrate, a first device die, first electrical connectors, an encapsulant, a redistribution structure, and a second device die. The first device die is attached to a side of the package substrate, and the first electrical connectors are mechanically and electrically coupled to the side of the package substrate. The encapsulant at least laterally encapsulates the first electrical connectors and the first device die. The redistribution structure is on the encapsulant and the first electrical connectors. The redistribution structure is directly coupled to the first electrical connectors. The first device die is disposed between the redistribution structure and the package substrate. The second device die is attached to the redistribution structure by second electrical connectors, and the second electrical connectors are directly coupled to the redistribution structure.

20 Claims, 11 Drawing Sheets

Related U.S. Application Data continuation of application No. 14/298,548, filed on Jun. 6, 2014, now Pat. No. 9,859,265.

(51) Int. Cl.
| | |
|---|---|
| *H01L 25/00* | (2006.01) |
| *H01L 23/00* | (2006.01) |
| *H01L 23/498* | (2006.01) |
| *H01L 21/56* | (2006.01) |
| *H01L 23/14* | (2006.01) |
| *H01L 23/15* | (2006.01) |
| *H01L 23/367* | (2006.01) |
| *H01L 23/31* | (2006.01) |

(52) U.S. Cl.
CPC .......... *H01L 23/5389* (2013.01); *H01L 24/97* (2013.01); *H01L 25/0652* (2013.01); *H01L 25/0655* (2013.01); H01L 21/561 (2013.01); H01L 23/145 (2013.01); H01L 23/15 (2013.01); H01L 23/3128 (2013.01); H01L 23/367 (2013.01); H01L 23/5385 (2013.01); H01L 24/13 (2013.01); H01L 24/16 (2013.01); H01L 24/32 (2013.01); H01L 24/73 (2013.01); H01L 24/81 (2013.01); H01L 2224/08225 (2013.01); H01L 2224/13111 (2013.01); H01L 2224/13116 (2013.01); H01L 2224/16227 (2013.01); H01L 2224/32225 (2013.01); H01L 2224/73204 (2013.01); H01L 2224/73253 (2013.01); H01L 2224/80 (2013.01); H01L 2224/81815 (2013.01); H01L 2224/97 (2013.01); H01L 2225/06517 (2013.01); H01L 2225/06572 (2013.01); H01L 2225/06589 (2013.01); H01L 2924/01029 (2013.01); H01L 2924/141 (2013.01); H01L 2924/1431 (2013.01); H01L 2924/1434 (2013.01); H01L 2924/15311 (2013.01); H01L 2924/15331 (2013.01); H01L 2924/18161 (2013.01); H01L 2924/3511 (2013.01)

(56) References Cited

U.S. PATENT DOCUMENTS

| | | | |
|---|---|---|---|
| 2004/0145051 A1* | 7/2004 | Klein | H01L 25/0652 257/734 |
| 2006/0046475 A1* | 3/2006 | Wark | H05K 1/115 257/E21.597 |
| 2007/0278635 A1* | 12/2007 | Xu | H01L 25/0655 257/E23.174 |
| 2008/0020559 A1 | 1/2008 | Chen et al. | |
| 2009/0008777 A1* | 1/2009 | Lin | H01L 24/19 257/738 |
| 2009/0057862 A1 | 3/2009 | Ha et al. | |
| 2010/0213588 A1 | 8/2010 | Hsieh et al. | |
| 2010/0213589 A1 | 8/2010 | Hsieh | |
| 2010/0252937 A1* | 10/2010 | Uchiyama | H01L 23/5389 257/777 |
| 2011/0278741 A1 | 11/2011 | Chua et al. | |
| 2011/0291293 A1* | 12/2011 | Tuominen | H01L 23/5389 257/774 |
| 2012/0068328 A1 | 3/2012 | Chen et al. | |
| 2012/0153467 A1* | 6/2012 | Chi | H01L 25/0652 257/737 |
| 2013/0037929 A1 | 2/2013 | Essig et al. | |
| 2013/0062761 A1 | 3/2013 | Lin et al. | |
| 2013/0168856 A1* | 7/2013 | Wang | H01L 23/3128 257/738 |
| 2013/0341784 A1 | 12/2013 | Lin et al. | |
| 2015/0170937 A1 | 6/2015 | Yu et al. | |
| 2015/0171055 A1 | 6/2015 | Yu et al. | |
| 2015/0171063 A1* | 6/2015 | Zhai | H01L 25/165 257/713 |
| 2015/0357309 A1 | 12/2015 | Liu et al. | |

\* cited by examiner

PACKAGE-ON-PACKAGE WITH REDISTRIBUTION STRUCTURE

PRIORITY CLAIM AND CROSS-REFERENCE

This application is a divisional of U.S. patent application Ser. No. 15/859,097, filed Dec. 29, 2017 and entitled "Package Structure and Methods of Forming the Same," now U.S. Pat. No. 10,515,941, issued Dec. 24, 2019, which is a continuation of U.S. patent application Ser. No. 14/298,548, filed Jun. 6, 2014, now U.S. Pat. No. 9,859,265, issued Jan. 2, 2018, and entitled "Package Structure and Methods of Forming the Same," which application is incorporated herein by reference

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications—particularly consumer mobile products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
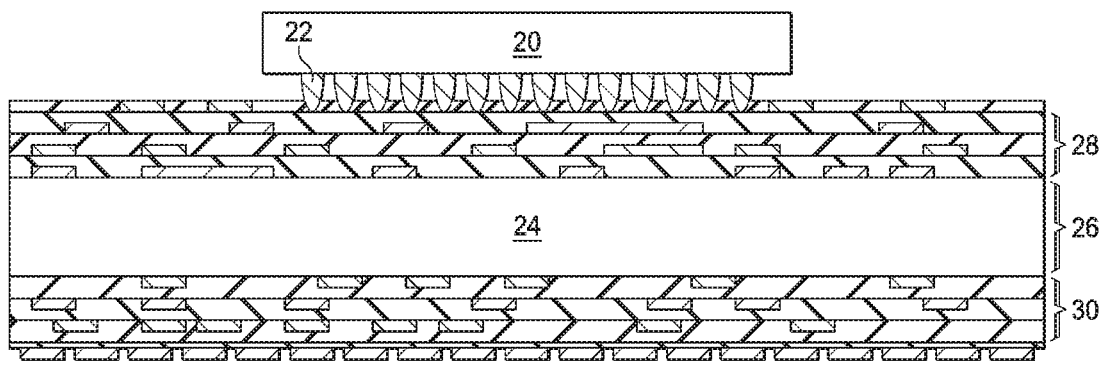
FIGS. 1 through 9 are intermediate structures of a package during a first process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Redistribution Package-on-Package (PoP) structure and methods of forming the same are provided in accordance with various embodiments. The intermediate stages of forming the Redistribution PoP structure are illustrated in accordance with some embodiments. Some variations of the embodiments are discussed, and persons of ordinary skill in the art will readily understand other modifications. Although various processes are described in particular orders, embodiments may be performed in any logical order.

FIGS. 1 through 9 illustrate intermediate structures during a first process according to an embodiment. Referring to FIG. 1, a device die 20 is attached to a package substrate 24. In some embodiments, package substrate 24 comprises an integrated circuit (IC) substrate, a component level substrate, an interposer, a carrier substrate, or the like. Package substrate 24 may be a singulated package substrate or part of a substrate that includes a plurality of identical package substrates 24. For example, package substrate 24 may be located in an un-sawed package substrate strip or wafer that comprises a plurality of package substrates formed as an array.

In some embodiments, package substrate 24 is a core-substrate including a core 26, a front-side redistribution structure 28, and a back-side redistribution structure 30, and vias, such as through-vias, extending through the core 26 to electrically couple the redistribution structures 28 and 30. The front-side redistribution structure 28 is on an opposite side of the core 26 from the back-side redistribution structure 30. The vias extend from the front-side of the core 26 to the back-side of the core 26. Although "front-side" and "back-side" are used herein, their use is solely for convenience and ease of reference. Each redistribution structure 28 and 30 can comprise any number of dielectric layers, redistribution lines such as metal lines and/or traces disposed in the dielectric layers, and vias for interconnecting the redistribution lines through dielectric layers. In some embodiments, package substrate 24 is a laminate substrate, which comprises dielectric layers laminated together, and redistribution lines and vias in the dielectric layers. In some embodiments, core 26 is formed of fiber glass, epoxy, resin, glass fiber, prepreg (which comprises epoxy, resin, and/or glass fiber), resin coated Copper (RCC), molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), glass, a semiconductor material (such as in the form of a wafer), the like, combinations thereof, and multi-layers thereof. It is realized that package substrate 24 may have various other structures. For example, package substrate 24 may not include a core.

Package substrate 24 is configured to electrically couple conductive features at an exterior surface of the front-side redistribution structure 28 to conductive features at an exterior surface of the back-side redistribution structure 30, wherein the exterior surfaces are opposite surfaces of package substrate 24. The conductive features may be metal pads, for example.

The device die 20 is attached to the package substrate 24 by electrical connectors 22 electrically and mechanically coupled to an active side of the device die 20 and at least some of the conductive features at the exterior surface of the front-side redistribution structure 28. The device die 20 may include integrated circuit devices, such as transistors, capacitors, inductors, resistors, and/or the like. The device die 20 may be any type of die, for example, a logic die, an analog die, a memory die, or the like. The electrical connectors 22 may comprise any acceptable connector, such as a ball, a bump, a microbump, a metal pillar, a controlled collapse chip connection (C4), or the like. For example, the electrical connectors 32 may be solder bumps, and/or may comprise metal pillars, solder caps formed on metal pillars, and/or the like. When solder is used, the solder may comprise either eutectic solder or non-eutectic solder. The solder may comprise lead or be lead-free, and may comprise Sn—Ag, Sn—Cu, Sn—Ag—Cu, or the like. The device die 20 may be attached to the package substrate 24 using a pick-and-place tool and subsequently reflowing the electrical connectors or using direct metal-to-metal bonding.

Figure 2:
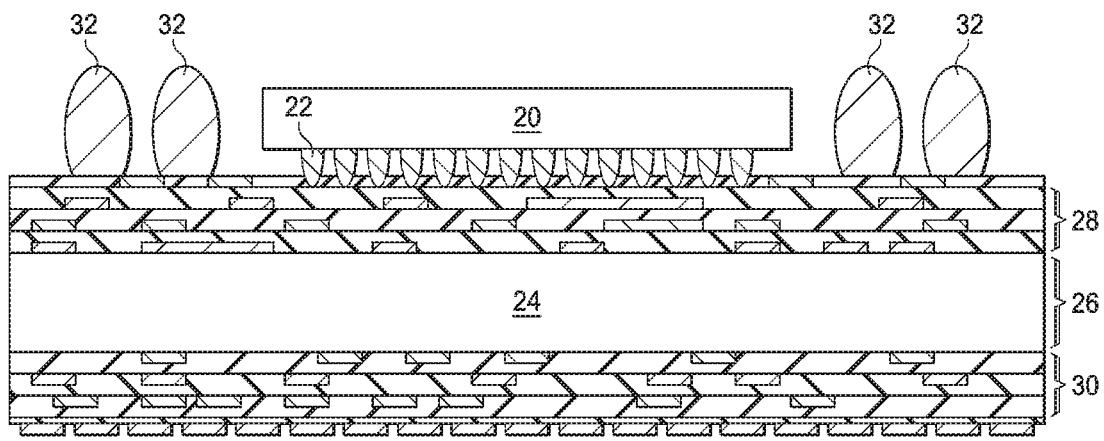

Referring to FIG. 2, electrical connectors 32 are formed on other conductive features at the exterior surface of the redistribution structure 28. The area of the exterior surface of the front-side redistribution structure 28 on which the electrical connectors 32 are formed is outside of or distinct from the area of the exterior surface of the front-side redistribution structure 28 to which the device die 20 is attached. In some embodiments, the electrical connectors 32 are solder balls, such as Ball Grid Array (BGA) balls. The solder may comprise lead or be lead-free, and may comprise Sn—Ag, Sn—Cu, Sn—Ag—Cu, or the like. In other embodiments, the electrical connectors 32 are stud bumps, which are formed by wire bonding on the conductive features, and cutting the bond wire with a portion of bond wire left attached to the respective bond ball. The wire may comprise copper, aluminum, nickel, gold, palladium, or the like, and may have a composite structure including a plurality of layers. In some embodiments, a height of the electrical connectors 32 from the exterior surface of the front-side redistribution structure 28 (e.g., in a direction normal to the exterior surface of the front-side redistribution structure 28) is greater than a height of the device die 20 from the exterior surface of the front-side redistribution structure 28. In other embodiments, the height of the electrical connectors 32 from the exterior surface is equal to or less than the height of the device die 20 from the exterior surface.

Figure 3:
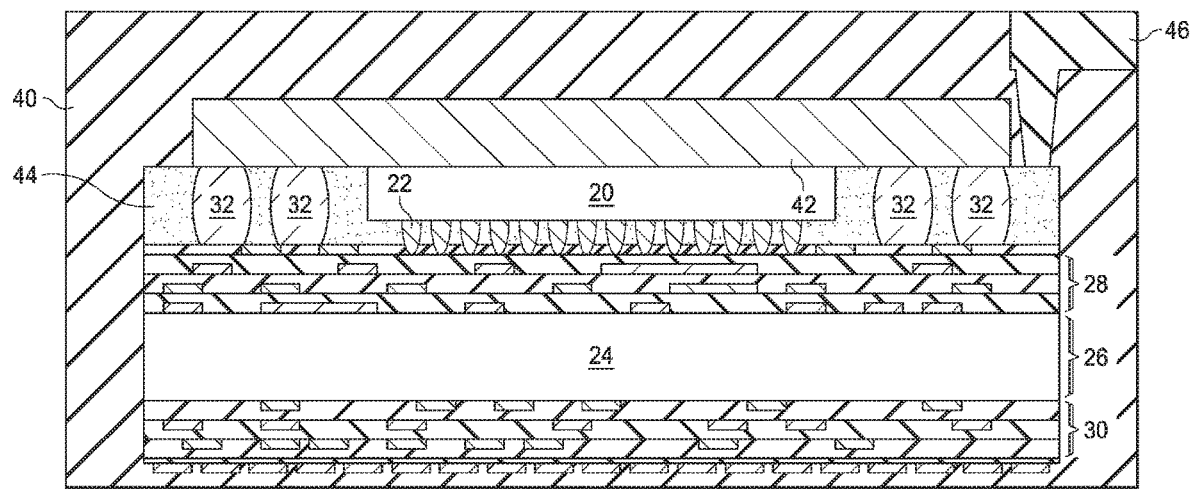

Referring to FIG. 3, the device die 20 and the electrical connectors 32 are encapsulated by an encapsulant 44 on the exterior surface of the front-side redistribution structure 28. In this embodiment, the encapsulation is performed using transfer molding. The device die 20 and package substrate 24, along with corresponding components, are placed in a mold cavity of a mold chase 40. A compressible contact material 42 is in the mold cavity of the mold chase 40. The compressible contact material 42 may, as illustrated, contact the electrical connectors 32 and the surface of the device die 20 distal from the package substrate 24. This contact may allow for some surfaces of the electrical connectors 32 and device die 20 to not be encapsulated by the encapsulant 44 during the molding process. In an embodiment, the compressible contact material 42 is rubber, such as silicone rubber, or the like. In other embodiments, the compressible contact material 42 may be omitted.

The encapsulant 44, in a flowable form, such as melted, is provided to the mold cavity using a sprue and runner system 46. The sprue and runner system 46 may supply the encapsulant under relatively high pressure to force the encapsulant 44 around the device die 20, around the electrical connectors 32, and between the electrical connectors 22 between the device die 20 and the package substrate 24. A vacuum may be applied to the mold cavity to assist in the flow of the encapsulant 44, such as providing a pressure differential between the sprue and runner system 46 and the cavity. With the encapsulant 44 being between the electrical connectors 22 between the device die 20 and the package substrate 24, the encapsulant 44 is filled into the gap between device die 20 and package substrate 24, and may be in contact with, and surrounds, the electrical connectors 22 such that the encapsulant 44 acts as an underfill. The encapsulant 44 may include a filler, a polymer, and a hardener in accordance with some embodiments. The polymer may be a molding compound, an underfill, a Molding Underfill (MUF), a resin, an epoxy, or the like. A curing step may then be performed to cure and solidify the encapsulant 44. Other encapsulating processes may be used, such as lamination, compression molding, or the like.

Figure 4:
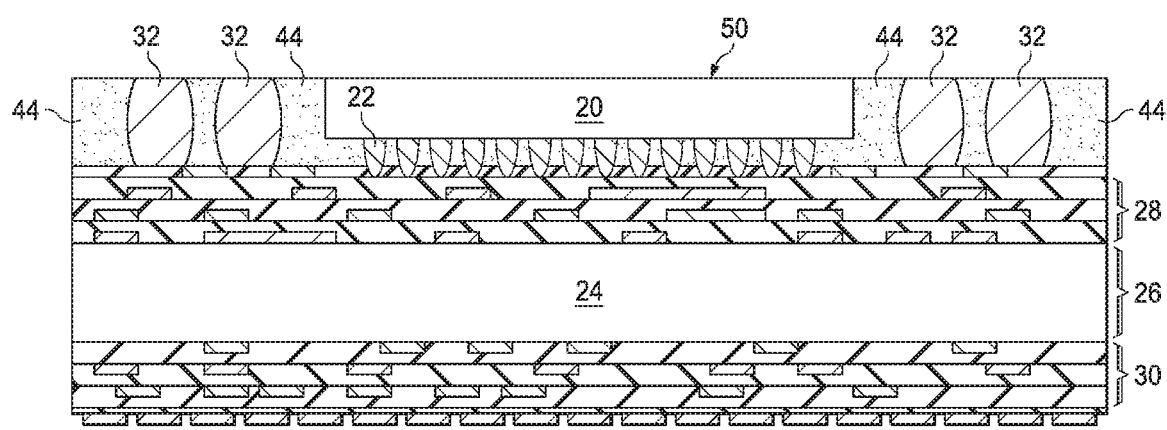

Referring to FIG. 4, the encapsulant 44, electrical connectors 32, and/or device die 20 may be subjected to a grinding and/or polishing process to at least expose surfaces of the electrical connectors 32. The grinding and/or polishing process may use, for example, a chemical mechanical polish (CMP) process to planarize surface 50 such that the electrical connectors 32 are exposed through the encapsulant 44 at the surface 50. In some embodiments, the device die 20 can be similarly exposed. In some embodiments, this grinding and/or polishing step may be omitted, for example, when the compressible contact material 42 makes sufficient contact to the electrical connectors 32 and/or device die 20 during the encapsulating process such that the encapsulant is not formed on the exposed surfaces of the electrical connectors 32 and/or device die 20.

Even if sufficient contact is made by the compressible contact material 42, the grinding and/or polishing process may be performed to ensure proper manufacturing quality. In embodiments where the electrical connectors 32 are formed with a height greater than a height of the device die 20 (as previously discussed), the electrical connectors 32 may be exposed through the encapsulant 44 while the surface of the device die 20 distal from the package substrate 24 may be encapsulated with the encapsulant 44, or the electrical connectors 32 may undergo grinding and/or polishing until a height of the electrical connectors 32 is equal to a height of the device die 20. In embodiments where the electrical connectors 32 were formed with a height less than a height of the device die 20 (as previously discussed), the device die 20 may be thinned by grinding and/or polishing until the electrical connectors 32 are exposed through the encapsulant 44, in which case a height of the electrical connectors 32 may be equal to a height of the device die 20.

Figure 5:
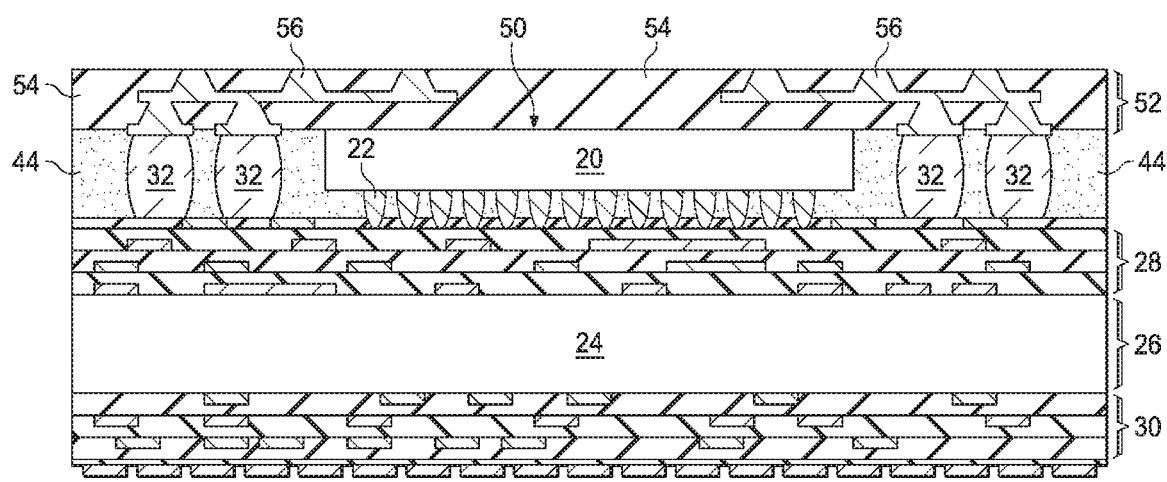

Referring to FIG. 5, a package redistribution structure 52 is formed on surface 50. In some embodiments, the package redistribution structure 52 may be formed using thin film processing. In some embodiments, the package redistribution structure 52 comprises one or more dielectric layer 54, such as a polymer layer, with one or more metallization pattern 56.

For example, the package redistribution structure 52 is formed by forming a dielectric layer, such as a polymer layer, over the surface 50, e.g., including surfaces of the encapsulant 44 and electrical connectors 32. The dielectric layer may comprise a polymer, such as a polybenzoxazole (PBO), polyimide, benzocyclobutene (BCB), the like, or a combination thereof. The dielectric layer can be deposited by a spin coating process, laminating process, the like, or a combination thereof. Openings are formed through the dielectric layer to portions of the electrical connectors 32 using an acceptable photolithography technique, such as including exposing to light the portions of the dielectric layer where the openings are to be formed. The dielectric layer may be developed and/or cured after the exposure.

Further in this example, a seed layer is deposited on the dielectric layer and in openings in the dielectric layer, such as to directly couple the electrical connectors 32. The seed layer can be copper, titanium, the like, or a combination thereof deposited by atomic layer deposition (ALD), sputtering, another physical vapor deposition (PVD) process, or the like. A photoresist is deposited and patterned exposing a pattern for a metallization pattern that is desired, such as by an acceptable photolithography technique. A conductive material, such as metal like copper, aluminum, the like, or a combination thereof, is deposited on the seed layer by electroless plating, electroplating, or the like. The photoresist is removed, such as by an appropriate photoresist stripping process. Remaining exposed seed layer portions are removed, such as by a wet or dry etch. The conductive material that remains may form a metallization pattern that is, for example, directly coupled to respective ones of the electrical connectors 32. This process may be repeated any number of times to form the package redistribution structure 52. For example, a subsequent dielectric layer can be formed over the dielectric layer and opening formed through the subsequent dielectric layer to the underlying metallization pattern. A seed layer can be deposited on the subsequent dielectric layer and in the openings through the subsequent dielectric layer to the underlying metallization pattern, and a subsequent metallization pattern can be formed on the seed layer, like discussed above. The metallization patterns may comprise any pattern, such as comprising vias through an underlying dielectric layer and/or traces or lines on an underlying dielectric layer. A top-most metallization pattern may comprise exposed pads to which electrical connectors may subsequently be attached.

Figure 6:
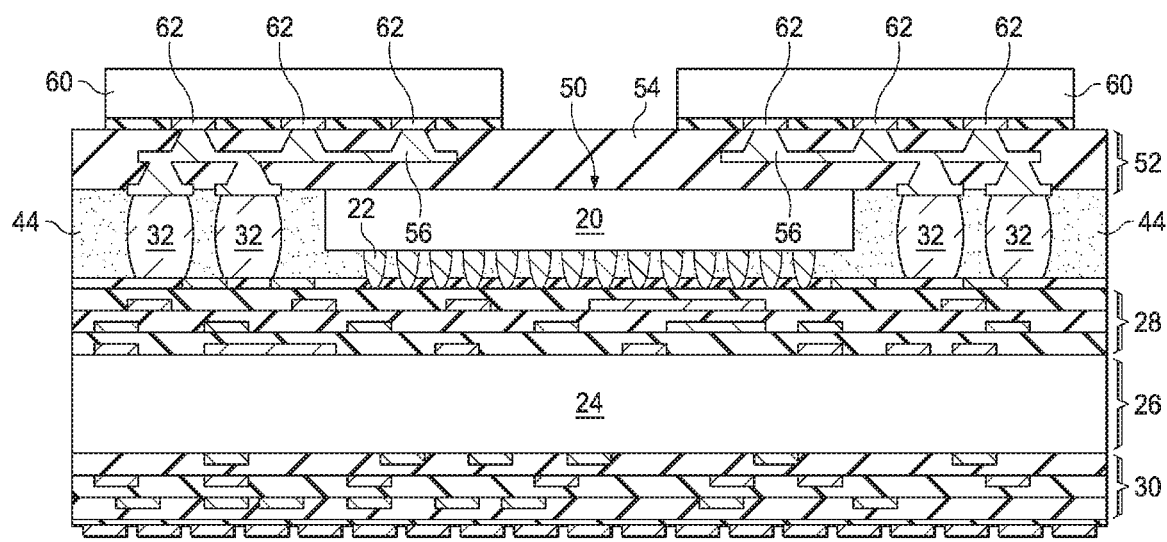

Referring to FIG. 6, device dies 60 are attached to the package redistribution structure 52 by electrical connectors 62 electrically and mechanically coupled to respective active sides of the device dies 60 and to the pads of the top-most metallization pattern of the package redistribution structure 52. The device dies 60 may include integrated circuit devices, such as transistors, capacitors, inductors, resistors, and/or the like. The device dies 60 may be any type of die, for example, a logic die, an analog die, a memory die, or the like. The electrical connectors 62 may comprise any acceptable connector, such as a ball, a bump, a microbump, a metal pillar, a controlled collapse chip connection (C4), or the like. For example, the electrical connectors 62 may be solder bumps, and/or may comprise metal pillars, solder caps formed on metal pillars, and/or the like. When solder is used, the solder may comprise either eutectic solder or non-eutectic solder. The solder may comprise lead or be lead-free, and may comprise Sn—Ag, Sn—Cu, Sn—Ag—Cu, or the like. The device dies 60 may be attached to the package redistribution structure 52 using a pick-and-place tool and subsequently reflowing the electrical connectors or using direct metal-to-metal bonding. More or less dies may be attached.

Figure 7:
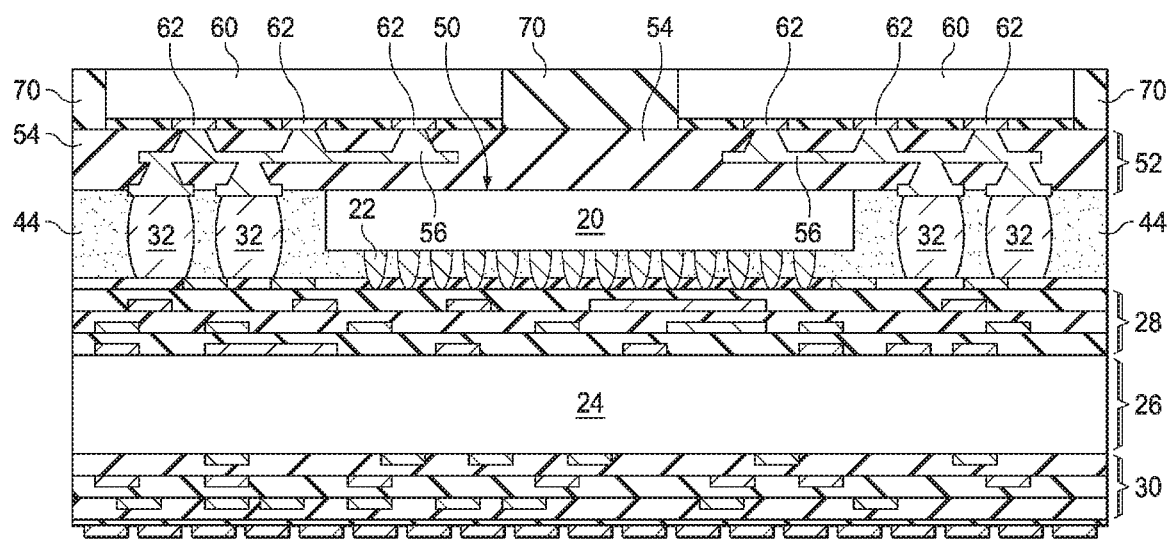

Referring to FIG. 7, the device dies 60 and the electrical connectors 62 are encapsulated by an encapsulant 70 on the exterior surface of the package redistribution structure 52. In this embodiment, the encapsulation is performed using transfer molding, as previously discussed with respect to FIG. 3. With the encapsulant 70 being between the electrical connectors 62 between the device dies 60 and the package redistribution structure 52, the encapsulant 70 is filled into the respective gaps between device dies 60 and package redistribution structure 52, and may be in contact with, and surround, the electrical connectors 62 such that the encapsulant 70 acts as an underfill. The encapsulant 70 may include a filler, a polymer, and a hardener in accordance with some embodiments. The polymer may be a molding compound, an underfill, a Molding Underfill (MUF), a resin, an epoxy, or the like. A curing step may then be performed to cure and solidify the encapsulant 70. Other encapsulating processes may be used, such as lamination, compression molding, or the like. In some embodiments, a grinding and/or polishing process may be used to expose surfaces of the device dies 60.

Figure 8:
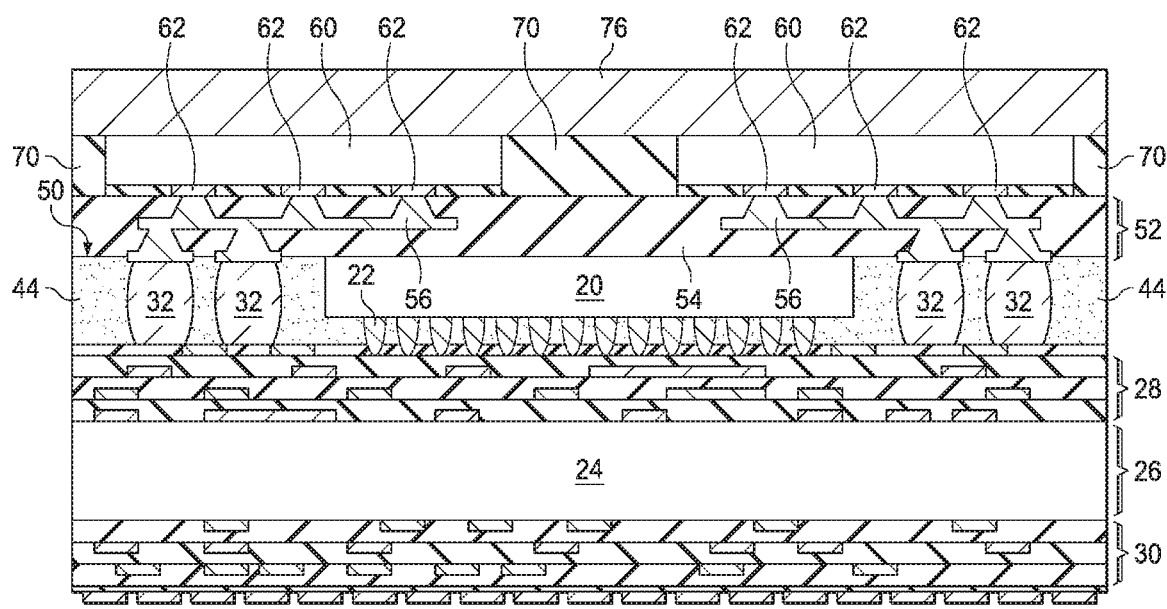

Referring to FIG. 8, a heat spreader 76 is adhered to device dies 60 and/or encapsulant 70 using an adhesive (not specifically illustrated), such as a thermal interface material (TIM). In some embodiments, the heat spreader 76 has high thermal conductivity and may also be a rigid material, such as a metal. The heat spreader 76 may comprise copper, aluminum, stainless steel, iron, or the like. The TIM may be an adhesive having a high thermal conductivity. In some embodiments, the TIM has a thermal conductivity higher than about 2 W/m*K or higher. Accordingly, heat generated in the package may be dissipated using the heat spreader 76, and the heat spreader 76 may provide additional rigidity to control warpage. In some embodiments, as shown in FIG. 8, an entirety of the heat spreader 76 is over and laterally coterminous with the package, e.g., over the device dies 60 and the encapsulant 70. In other embodiments, a heat spreader may take on other configurations. In further embodiments, a heat spreader may be omitted.

Figure 9:
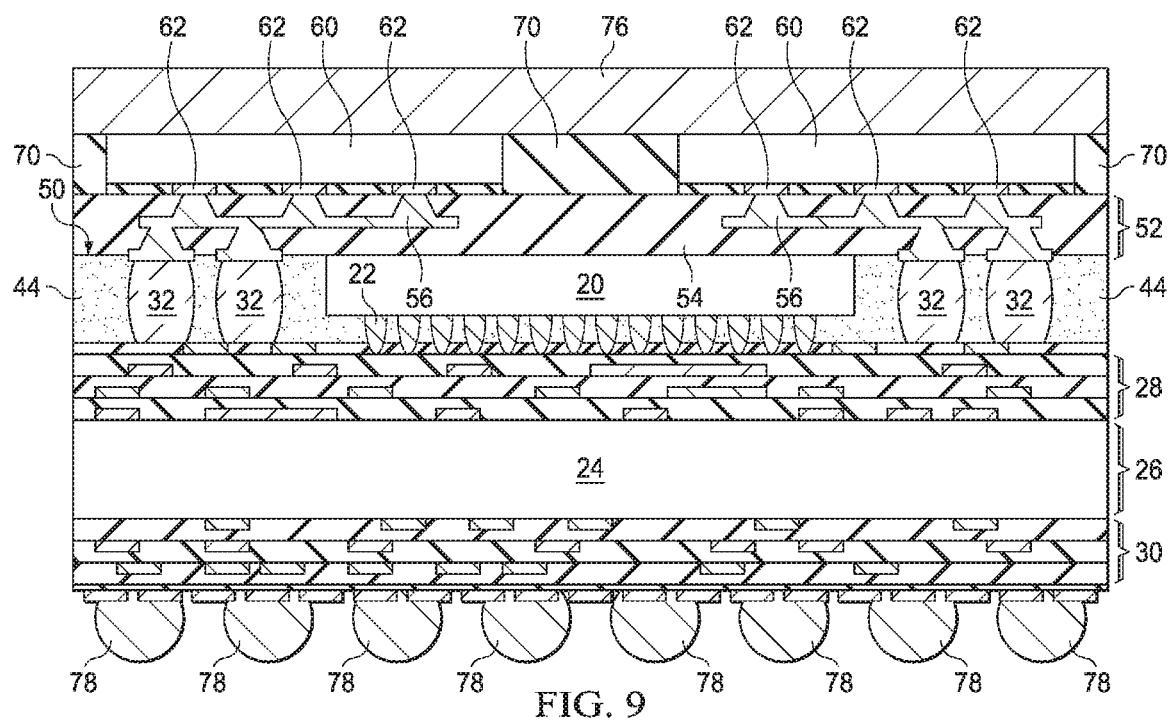

Referring to FIG. 9, electrical connectors 78 are formed on the exterior surface of the back-side redistribution structure 30 of the package substrate 24. This step is sometimes referred to as a ball mount process. In some embodiments, the formation of the electrical connectors 78 includes placing solder balls on the exposed portions of conductive features of the back-side redistribution structure 30, and then reflowing the solder balls. These solder balls may be ball grid array (BGA) balls. In other embodiments, the formation of electrical connectors 78 includes performing a plating step to form solder regions on the conductive features of the back-side redistribution structure 30, and then reflowing the solder regions to form solder balls. The electrical connectors 78 may also comprise metal pillars, or metal pillars and solder caps, which may also be formed through plating.

Figure 10:
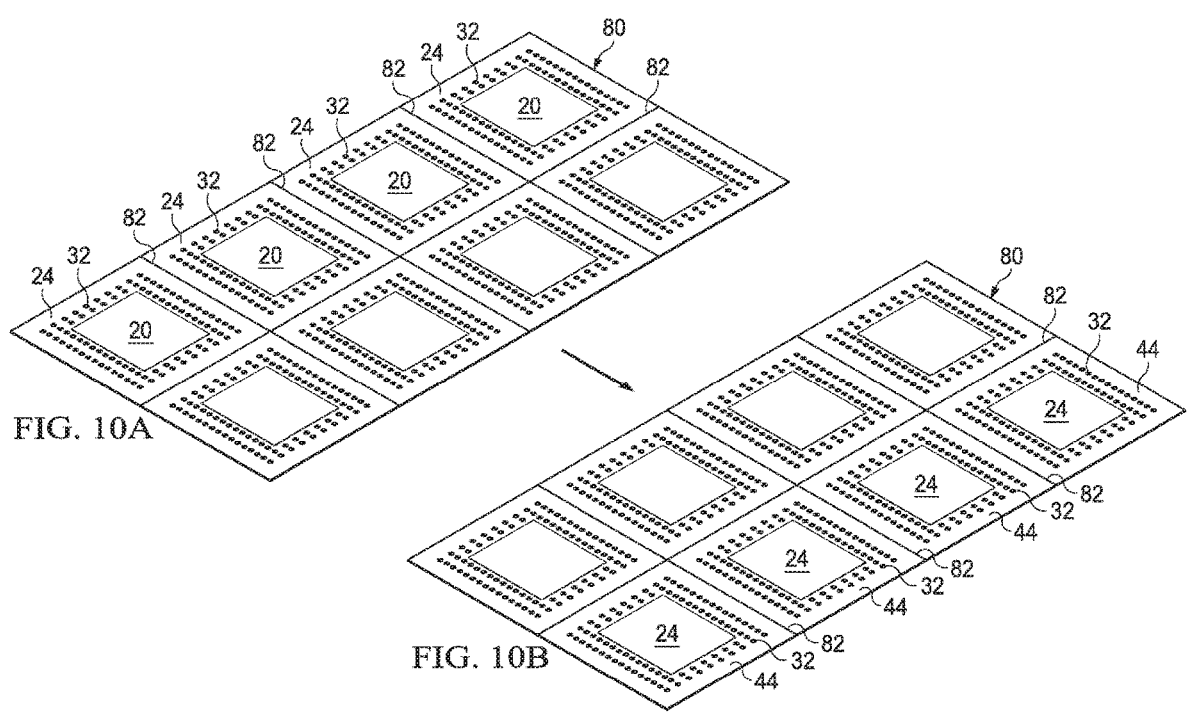
FIGS. 10A and 10B are intermediate structures illustrating aspects associated with panel level processing, such as panel level encapsulation, in accordance with some embodiments.

Other embodiments contemplate variations to the first process discussed with respect to FIGS. 1 through 9. For example, the encapsulation steps discussed with respect to FIGS. 3 and 7 may use other encapsulating processes. An example of another encapsulating process is panel level molding. FIGS. 10A and 10B illustrate aspects of panel level molding. In the example process described above, the package substrate 24 may be a singulated package substrate or may be a package substrate that is a portion of a wafer level substrate during the process. In FIGS. 10A and 10B, the package substrate 24 is a portion of a panel 80. The panel 80 may comprise multiple unsingulated package substrates 24 divided by dividing lines 82, such as saw lines. In these figures, the panel 80 is illustrated as having a 4×2 array of package substrates 24, but the panel 80 may have any number and any array of package substrates 24.

Similar to what was discussed above in FIGS. 1 and 2, device dies 20 and electrical connectors 32 are attached to and formed on the package substrates 24 of the panel 80 at the panel level. As illustrated in FIG. 10B, the encapsulation is performed at the panel level. The encapsulation may use lamination, compression molding, or the like, and the encapsulant 44 may be any material discussed above. As further illustrated in FIG. 10B, the electrical connectors 32 are exposed through the encapsulant 44. In some embodiments, a grinding and/or polishing process is performed to expose the electrical connectors 32, similar to what was discussed above with respect to FIG. 4. The process continues through the steps discussed with respect to FIGS. 5 and 6 on the panel level. Another encapsulation process is performed to encapsulate device dies 60, similar to what was discussed with respect to FIG. 7, on the panel level. The encapsulation may use lamination, compression molding, or the like, and the encapsulant 70 may be any material discussed above. In some embodiments, a grinding and/or polishing process is performed to expose the device dies 60, similar to what was discussed above with respect to FIG. 4. After this encapsulation, the packages may be singulated, such as by sawing or dicing along the dividing lines 82. Thereafter, a heatspreader 76 and electrical connectors 78 may be attached and formed on the singulated packages as discussed with respect to FIGS. 8 and 9. Other embodiments contemplate molding using any acceptable technique for any encapsulation process discussed above and any combination of encapsulation processes. For example, the encapsulation process discussed with respect to FIG. 3 may be performed on the panel level, and the encapsulation process discussed with respect to FIG. 7 may be with singulated packages.

Figure 11:
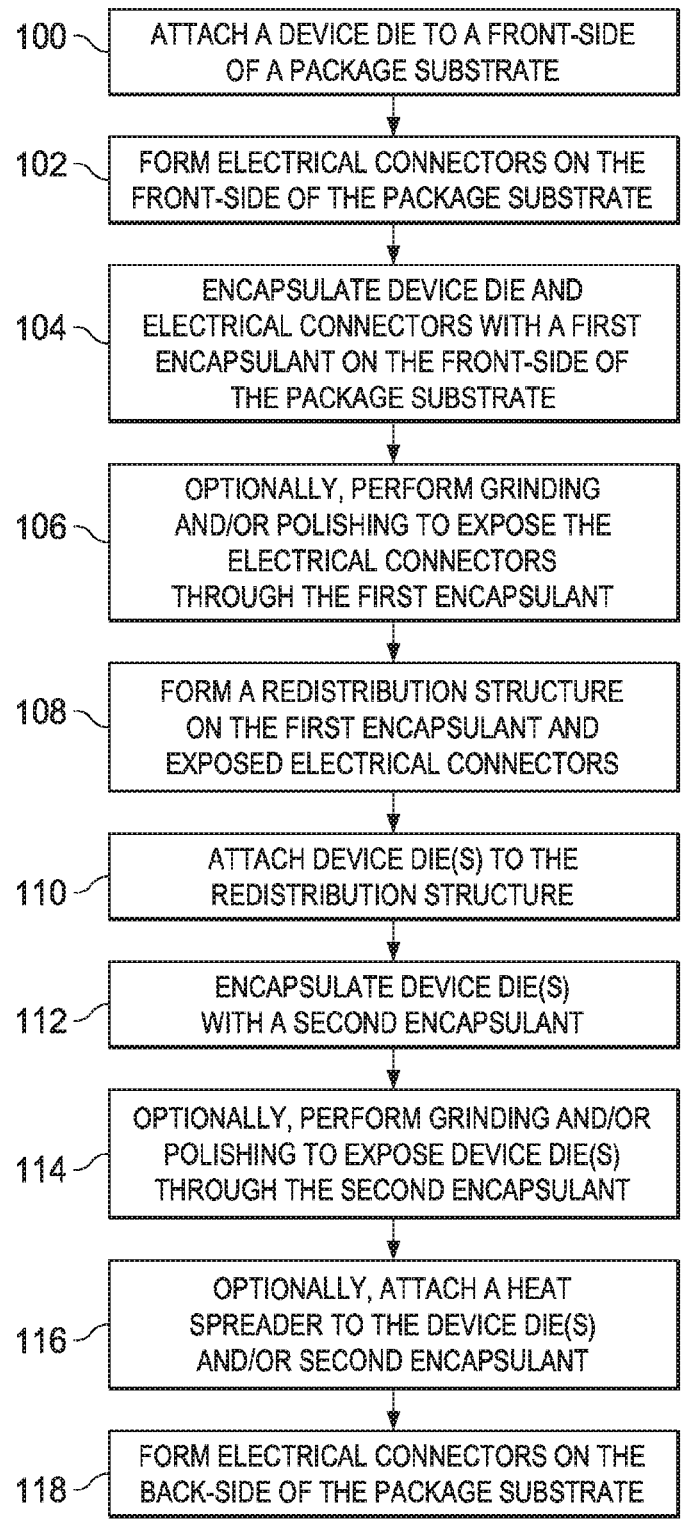
FIG. 11 is a flow chart illustrating steps of a first process in accordance with some embodiments.

Referring to FIG. 11, a flow chart is shown illustrating steps of a first process according to an embodiment. In this embodiment, the process may be performed with a singulated package substrate or a package substrate that is part of a wafer. In step 100, a device die is attached to a front-side of a package substrate, such as discussed above with respect to FIG. 1. In step 102, electrical connectors are formed on the front-side of the package substrate, such as discussed above with respect to FIG. 2. In step 104, the device die and the electrical connectors are encapsulated on the front-side of the package substrate with a first encapsulant, such as discussed above with respect to FIG. 3. In step 106, a grinding and/or polishing process is optionally performed to expose the electrical connectors through the first encapsulant, such as discussed above with respect to FIG. 4. In step 108, a redistribution structure is formed on the first encapsulant and exposed electrical connectors, such as discussed above with respect to FIG. 5. In step 110, device die(s) are attached to the redistribution structure, such as discussed above with respect to FIG. 6. In step 112, the device die(s) are encapsulated with a second encapsulant, such as discussed above with respect to FIG. 7. In step 114, a grinding and/or polishing process is optionally performed to expose the device die(s) through the second encapsulant. In step 116, a heat spreader is optionally attached to the device die(s) and/or the second encapsulant, such as discussed above with respect to FIG. 8. In step 118, electrical connectors are formed on the back-side of the package substrate, such as discussed above with respect to FIG. 9.

Figure 12:
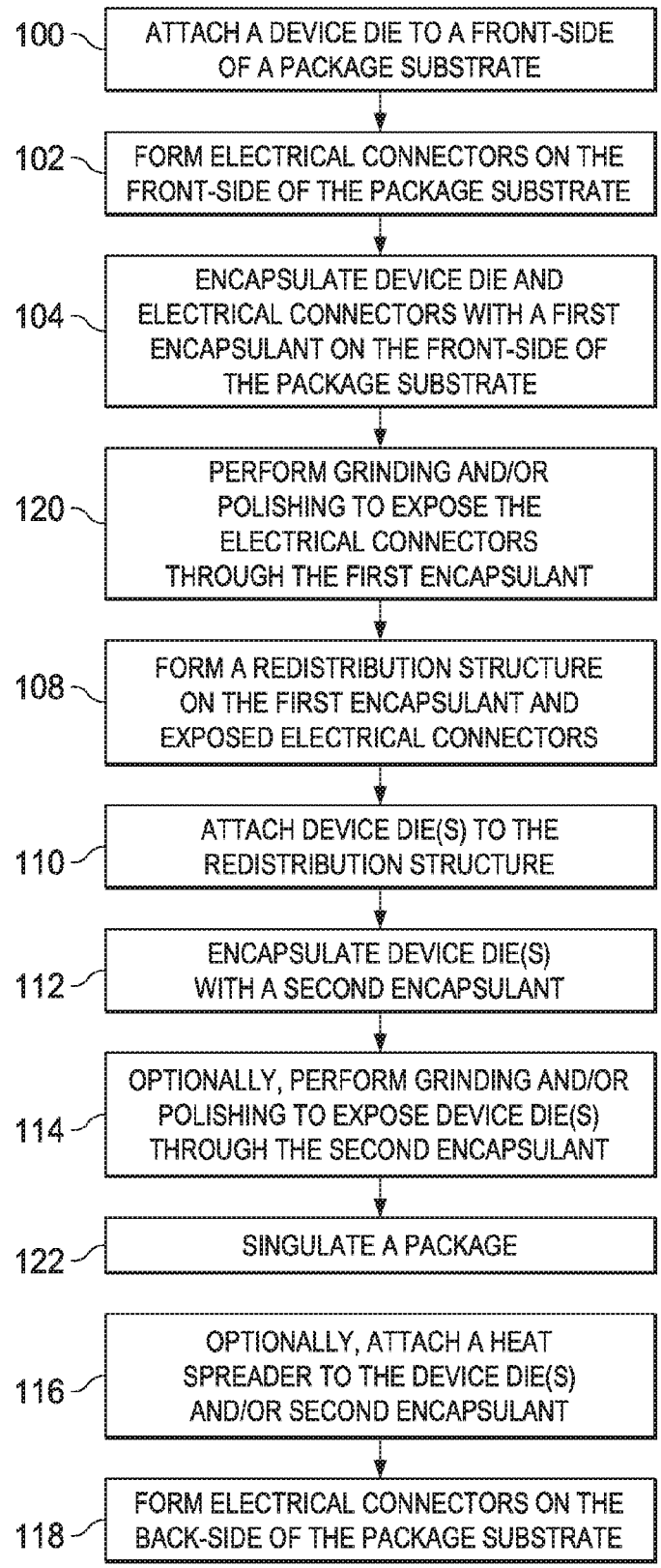
FIG. 12 is a flow chart illustrating steps of a second process in accordance with some embodiments.

Referring to FIG. 12, a flow chart is shown illustrating steps of a second process according to an embodiment. In this embodiment, the process may be performed with a package substrate that is part of a panel, as discussed above with respect to FIGS. 10A and 10B. Steps 100 through 104 are performed as discussed above with respect to FIG. 11. Then, in step 120, a grinding and/or polishing process is performed to expose the electrical connectors through the first encapsulant, such as discussed above with respect to FIG. 4. Then, steps 108 through 114 are performed as discussed above with respect to FIG. 11. In step 122, a package is singulated from the panel. Subsequently, steps 116 and 118 are performed as discussed above with respect to FIG. 11.

Embodiments may achieve advantages. Embodiments may achieve a thinner and smaller three-dimensional (3D) solution for a multiple-die package design. Further, some embodiments may achieve reduced interconnect lengths and ultra fine pitch capability compared to some conventional packages, such as conventional packages that use wire bonding. Further, by encapsulating the various dies as discussed above, warpage can be improved, and heat dissipation can be improved, particularly if a heat spreader is employed, for the 3D package. Additionally, by implementing thin film processes to form a package redistribution structure, such as package redistribution structure 52 discussed above, the need for an additional substrate in a package may be obviated, and any assembly and requisite entities or personnel associated with the assembly of that substrate may also be obviated.

An embodiment is a package. The package includes a package substrate, a first device die, first electrical connectors, an encapsulant, a redistribution structure, and a second device die. The first device die is attached to a side of the package substrate, and the first electrical connectors are mechanically and electrically coupled to the side of the package substrate. The encapsulant at least laterally encapsulates the first electrical connectors and the first device die. The redistribution structure is on the encapsulant and the first electrical connectors. The redistribution structure consists of one or more dielectric layer and one or more metallization pattern. The redistribution structure is directly coupled to the first electrical connectors. The first device die is disposed between the redistribution structure and the package substrate. The second device die is attached to the redistribution structure by second electrical connectors, and the second electrical connectors are directly coupled to the redistribution structure.

Another embodiment is a package. The package includes a first device die, electrical connectors, a redistribution structure, and a second device die. The first device die is at least laterally encapsulated on a side of a package substrate with an encapsulant. The electrical connectors are at least laterally encapsulated on the side of the package substrate and extend through to a surface of the encapsulant distal from the side of the package substrate. The redistribution structure adjoins the surface of the encapsulant distal from the side of the package substrate. The redistribution structure consists of one or more dielectric layer and one or more metallization pattern. The second device die is attached to the redistribution structure, and the redistribution structure is disposed between the first device die and the second device die.

A further embodiment is a method. The method comprises attaching a first device die to a first area on a side of a package substrate; forming electrical connectors on a second area of the side of the package substrate, the first area being distinct from the second area; at least laterally encapsulating the first device die and the electrical connectors with an encapsulant; forming a redistribution structure on the encapsulant and the electrical connectors; and after forming the redistribution structure, attaching a second device die to the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a substrate comprising a first redistribution structure disposed on a front side of a core and a second redistribution structure on a back side of the core opposite the front side of the core, wherein the substrate is free of active devices;
   a first semiconductor device disposed on the first redistribution structure, the first semiconductor device electrically connected to the first redistribution structure;
   a first encapsulant laterally surrounding the first semiconductor device;
   a third redistribution structure over and physically and directly contacting a top surface of the first semiconductor device, wherein the third redistribution structure is free of solder;
   an electrical connector extending through the first encapsulant from the first redistribution structure to the third redistribution structure, wherein a top surface of the electrical connector is level with the top surface of the first semiconductor device; and
   a second semiconductor die disposed directly on the third redistribution structure, the second semiconductor die electrically connected to the third redistribution structure.

2. The package of claim 1, further comprising a third semiconductor die disposed on the third redistribution structure, the third semiconductor die electrically connected to the third redistribution structure.

3. The package of claim 1, further comprising a second encapsulant at least laterally encapsulating the second semiconductor die.

4. The package of claim 1, further comprising a heat spreader adhered to the second semiconductor die.

5. The package of claim 1, wherein the third redistribution structure is planar.

6. The package of claim 1, wherein a bottom surface of the electrical connector is level with a surface of the first encapsulant.

7. The package of claim 1, wherein the electrical connector has curved sidewalls.

8. A package comprising:
   a package substrate free of active devices, the package substrate comprising a first redistribution structure, a core below the first redistribution structure, and a second redistribution structure below the core;
   a first device die attached to the first redistribution structure, wherein the first device die is electrically connected to the first redistribution structure by first connectors;
   second connectors attached to the first redistribution structure, wherein the second connectors are electrically connected to the first redistribution structure;
   a first encapsulant laterally surrounding the first device die and the second connectors, wherein surfaces of the first device die, the second connectors, and the first encapsulant are level;
   a third redistribution structure extending over the first encapsulant, the first device die, and the second connectors, wherein the third redistribution structure directly contacts the first encapsulant, wherein a first side of the third redistribution structure is electrically connected to the second connectors, wherein the third redistribution structure comprises a conductive line directly contacting one of the second connectors, the third redistribution structure being free of solder; and
   a second device die attached directly to a second side of the third redistribution structure that is opposite the first side, wherein the second device die is electrically connected to the third redistribution structure.

9. The package of claim 8, wherein a surface of the first device die that faces the first redistribution structure is vertically separated from the first redistribution structure.

10. The package of claim 8, wherein the first encapsulant laterally surrounds each of the first connectors.

11. The package of claim 8, wherein the second device die overlaps the first device die.

12. The package of claim 8, further comprising a second encapsulant laterally surrounding the second device die.

13. The package of claim 8, further comprising a heat spreader attached to the second device die.

14. The package of claim 8, wherein the second connectors each comprise solder.

15. A package comprising:
   a first device die on a first side of a package substrate, the package substrate comprising a back side redistribution structure, a front side redistribution structure, and a core interposed between the back side redistribution structure and the front side redistribution structure, the package substrate being free of active devices, wherein the first device die is laterally encapsulated by a first encapsulant;
   electrical connectors on the first side of the package substrate, wherein the electrical connectors are laterally encapsulated by the first encapsulant, wherein the electrical connectors have a full height that is the same as a full height of the first encapsulant;
   a redistribution structure extending over and physically contacting the first encapsulant, the electrical connectors, and the first device die, wherein a top surface of the redistribution structure is level, wherein the redistribution structure is free of solder;

a second device die directly contacting the top surface of the redistribution structure by direct metal-to-metal bonding, wherein the second device die is electrically connected to at least one electrical connector by the redistribution structure; and a third device die attached to the top surface of the redistribution structure laterally adjacent to the second device die.

16. The package of claim 15, wherein the redistribution structure extends vertically from the first device die to the second device die.

17. The package of claim 15, further comprising a second encapsulant, wherein the second encapsulant at least laterally encapsulates the second device die and at least laterally encapsulates the third device die.

18. The package of claim 15, wherein a full bottom surface of the redistribution structure is level.

19. The package of claim 15, wherein the electrical connectors each comprise solder.

20. The package of claim 15, wherein a top surface of the first device die and a top surface of the first encapsulant are level.

* * * * *